United States Patent

Kawana et al.

[11] Patent Number: 5,327,023
[45] Date of Patent: Jul. 5, 1994

[54] PROGRAMMABLE LOGIC DEVICE

[75] Inventors: Keiichi Kawana; Norimitsu Sako, both of Tokyo, Japan

[73] Assignee: Kawasaki Steel Corporation, Hyogo, Japan

[21] Appl. No.: 857,986

[22] Filed: Mar. 26, 1992

[30] Foreign Application Priority Data

Mar. 28, 1991 [JP] Japan .................. 3-064626
Apr. 25, 1991 [JP] Japan .................. 3-095179

[51] Int. Cl.$^5$ .......................... H03K 19/173
[52] U.S. Cl. ...................... 307/465; 302/465.1
[58] Field of Search ................. 307/465–469

[56] References Cited

U.S. PATENT DOCUMENTS

| | | | |
|---|---|---|---|
| 4,758,745 | 7/1988 | El Gamal et al. | 307/584 |
| 4,873,459 | 10/1989 | El Gamel et al. | 307/465 |
| 5,015,885 | 5/1991 | El Gamal et al. | 307/465 |
| 5,083,083 | 1/1992 | El Ayat et al. | 307/468 |
| 5,144,166 | 9/1992 | Camarota | 307/465 |

Primary Examiner—Edward P. Westin
Assistant Examiner—Andrew Sanders
Attorney, Agent, or Firm—Oliff & Berridge

[57] ABSTRACT

A programmable logic device of the present invention is constructed to reduce the number of switching elements in wire switches when programmably connecting logical elements by using wire groups. A plurality of programmable wire groups are wired in vertical and horizontal channels between logical elements arranged in array. The wire groups are combined to intersect preferably in crosses. The wire groups are short-circuit-connected at the intersections or connected through programmable switching elements. Programmable connections are effected through wire switching means middled between the wire elements provided between the adjacent intersections. Hence, the programmable logic device of this invention is capable of reducing the areas occupied by the switching elements in the switching means and attaining a high degree of freedom of wiring and a high integration.

13 Claims, 11 Drawing Sheets (a)

PRIOR ART

|  | upper<br>a b c | down<br>g h i | right<br>d e f | left<br>j k l |
|---|---|---|---|---|
| upper  a<br>b<br>c |  |  |  |  |
| down  g<br>h<br>i | ○ ○ ○<br>○ ○ ○<br>○ ○ ○ |  |  |  |
| right  d<br>e<br>f | ○ ○ ○<br>○ ○ ○<br>○ ○ ○ | ○ ○ ○<br>○ ○ ○<br>○ ○ ○ |  |  |
| left  j<br>k<br>l | ○ ○ ○<br>○ ○ ○<br>○ ○ ○ | ○ ○ ○<br>○ ○ ○<br>○ ○ ○ | ○ ○ ○<br>○ ○ ○<br>○ ○ ○ |  |

PROGRAMMABLE LOGIC DEVICE

BACKGROUND OF THE INVENTION

The present invention relates to a programmable logic device including a plurality of logical elements and capable of arbitrarily programmably connecting these logical elements and, more particularly, to a programmable logic device capable of enhancing a switch using efficiency of wire groups by reducing the number of switching elements to be embedded.

A conventional programmable logic device 50 is, as illustrated in FIG. 9, composed of logical elements 51 arranged in array and wire groups 52, 53 each consisting of, e.g., 3 lengths of wires extending lengthwise or crosswise between these logical elements 51. Programmable wire switches 54 including switching elements for programmably connecting the vertical and horizontal wires are provided at intersections of the horizontally and vertically arranged wire groups 52 and 53, respectively. Further, I/O switches 55, 56 are provided for every vertical wire group 53 corresponding to the respective logical elements 51. Input signals from I/O switch 55 to the logical element 51 are transferred and received via, e.g., four wires 57 between the logical element 51 and the vertical wire group 53, while output signals from the logical element 51 to the I/O switch 56 are transferred and received via, e.g., two wires 58 between the logical element 51 and the vertical wire group 53.

The above-mentioned programmable wire switch (hereinafter simply referred to as a wire switch) 54 is required to include, for instance, at least 54 pieces of switching elements in the conventional device of FIG. 9 to programmably mutually connect all the wires extending in the vertical and horizontal directions. More specifically, as in a wiring example shown in FIG. 10, it is required that 9 switching elements 59 be provided for one combined wire thereof. As can be understood from a combination in the wiring example shown in FIG. 11, it follows that 54 pieces of switching elements 59 are needed. Namely, all the wires are connectable by the 54 switches. Note that in FIG. 11, the mark ○ indicates the switching elements 59. This switching element 59 may involve the use of a memory-attached switching element 63, e.g., constructed by connecting a gate electrode of an NMOS transistor 61 to a simply illustrated SRAM cell 60 depicted in FIG. 8(a) and 8(b). All or a part of the wires are connectable or disconnectable from each other through the memory-attached switches, whereby arbitrary wiring can be programmably actualized.

The thus constructed programmable logic device 50 described above, however, presents the following problem. When connecting the signals between the adjacent logical elements 51, the number of the switching elements 59 in the wire switches 54 tends to increase for making the wire switches 54 connectable to the 3-way wires after the passage. That is, when the number of the connected elements increases, a parasitic capacity augments, or the area enlarges. This causes a defect in which the operation speed is decreased.

BRIEF SUMMARY OF THE INVENTION

It is a primary object of the present invention, which has been devised to obviate the foregoing problems inherent in the prior art, to provide a programmable logic device capable of reducing the number of switching elements in wire switches when programmably connecting adjacent logical elements by use of wire groups.

To obviate the above-mentioned problems, according to one aspect of the invention, there is provided a programmable logic device comprising: a plurality of logical elements arranged in array; and wire means disposed in vertical and horizontal channels between the logical elements to connect arbitrarily programmably the logical elements, wherein the wire means include: wire groups consisting of a plurality of wire elements and combinable to intersect each other; connecting means, provided at intersections of the wire groups, for connecting the two wire groups combinable to intersect each other; and switching means, provided between the adjacent intersections, for programmably mutually connecting the plurality of wire elements of the wire group.

Preferably, said connecting means short-circuit-connects said two wire elements.

Preferably, said wire elements of said wire groups are short-circuit-connected in crosses.

Preferably, said connecting means is composed of programmable switching elements for determining a connection or disconnection of said two wire elements.

Preferably, said wire elements of said wire groups are combined in crosses at said intersections.

Preferably, said two wire elements of said wire groups intersect each other at said intersection.

Preferably, said two wire elements of said wire groups intersect each other in cross at said intersection.

BRIEF DESCRIPTION OF THE DRAWINGS

Other objects and advantages of the present invention will become apparent during the following discussion taken in conjunction with the accompanying drawings, in which:

FIG. 11 is a diagram illustrating a possible combination of programmable wire switches.

DETAILED DESCRIPTION OF THE INVENTION

The present inventors have studied and researched a large number of design examples of a programmable logic device, and it has proven that a great majority (60% or more) of wires between the logical elements connect the logical elements adjacent to each other. The present invention, which has been devised based on results of the above-described research, presents an improvement to make smaller, when mutually connecting the adjacent wirings, the number of switching elements in switching means for programmably connecting the wirings to each other on average than in the conventional wiring structures.

More specifically, according to the present invention, wire means capable of programmably, arbitrarily, vertically and horizontally connecting logical elements are so constructed that two groups of wire elements combined to intersect are, e.g., short-circuit-connected at intersections of the wire groups combined to intersect, preferably at cross intersections; or alternatively the two groups of wire elements are connected or disconnected by use of programmable switching elements. Simultaneously, the wire means are constructed so that the parallel wire elements are connected or disconnected by wire switching means including the programmable switching elements middled between the adjacent intersections described above. With these constructions, it is possible to reduce the number of the employed switching elements particularly in the wire switching means. For example, in the wire means where the cross short-circuit connections are provided at the intersections, the cross wire elements divided by the switching means are connected in the programmable manner by the switching elements of the switching means. Based on this programmable switching, the wires in the rectilinear direction are programmably connectable. Hence, the number of the switching elements of the switching means—e.g., the number of MOSFETs used therefor—can be reduced by a factor of 3 as compared with a case where the 3-way wires from one direction are programmably connected as in the prior art. The switch using efficiency can be thereby increased. Simultaneously, the space can be saved by diminishing the areas occupied by the switching elements in order to attain a high integration.

A programmable logic device according to the present invention will hereinafter be described in detail by way of referred embodiments illustrated in the accompanying drawings.

Figure 1:
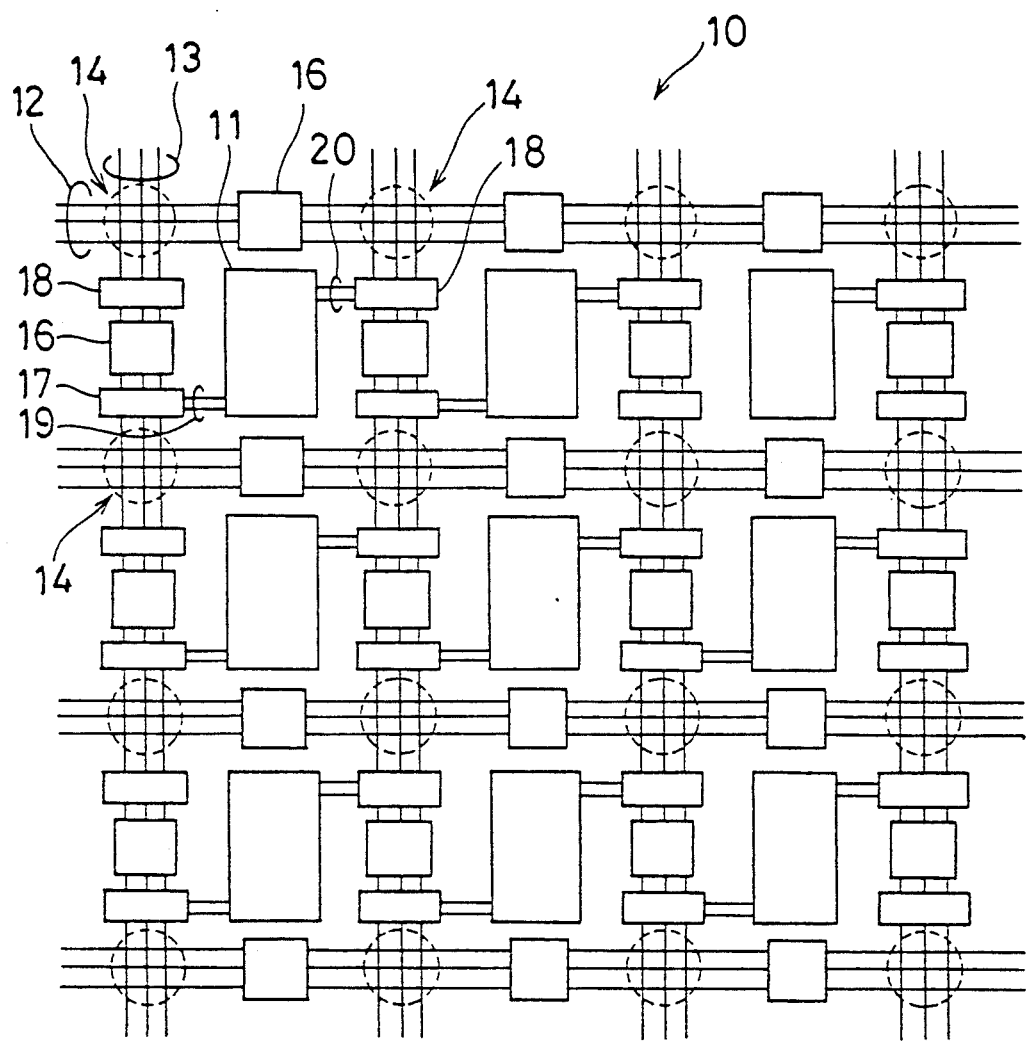
FIG. 1 is a conceptual block diagram illustrating a construction of one embodiment of a programmable logic device according to the present invention.

FIG. 1 is a conceptual block diagram illustrating the programmable logic device of this invention. The programmable logic device 10 comprises: a plurality of logical elements 11 arranged in array; wire groups 12, 13 each consisting of three signal wires disposed lengthwise and crosswise between the logical elements 11, e.g., to intersect each other in crosses; connecting means for connecting the corresponding wires (elements) to each other in the lengthwise and crosswise directions at these intersections 14; and programmable wire switching means (hereinafter simply referred to as wire switches) 16 middled between the respective intersections 14 in the lengthwise and crosswise directions and capable of programmably mutually connecting the wire elements of the wire groups 12 or 13 in the lengthwise or crosswise direction. The wire groups 12, 13, the connecting means of these intersections 14 and the wire switches 16 are herein combined to constitute wire means according to the present invention which are capable of arbitrarily, programmably, vertically and horizontally connecting the logical elements 11 disposed in array.

Further, I/O switches 17, 18 for programmably connecting input and output terminals of the respective logical elements 11 are provided on both sides of the wire switches 16 disposed in the vertical wire groups 13. Then, two lengths of input lines 19 are connected to the inputs of the logical elements 11 from the I/O switches 17. Two lengths of output lines 20 are also connected to the I/O switches 18 from the outputs of the logical elements 11.

Figure 2:
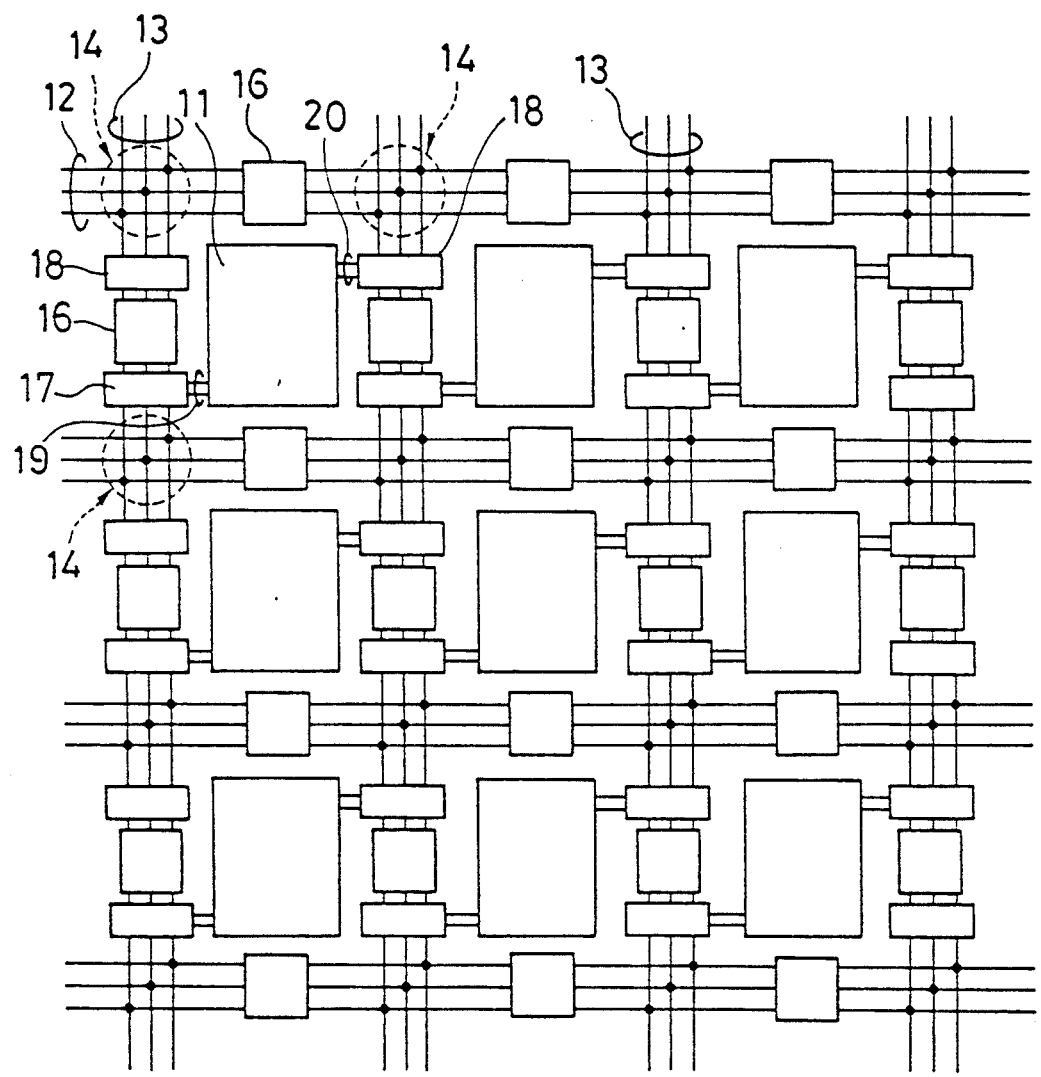
FIG. 2 is a conceptual diagram illustrating a concrete construction of one embodiment of the programmable logic device of this invention.
Figure 3:
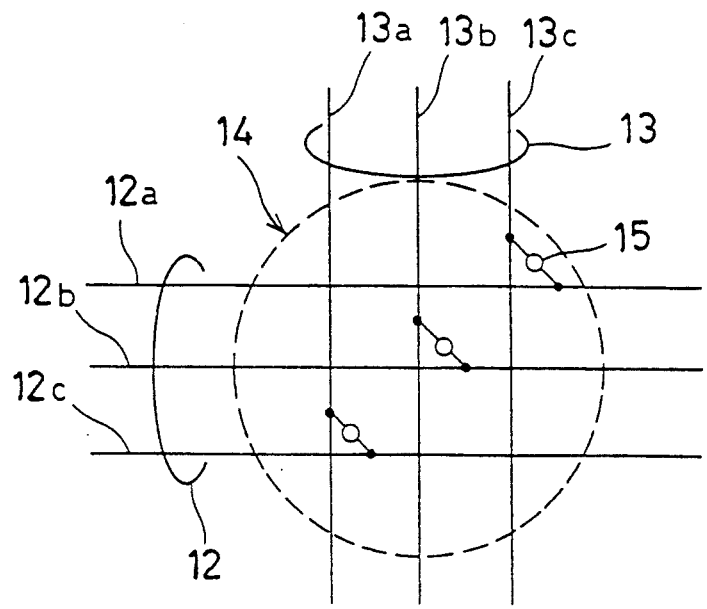
FIG. 3 is a diagram showing one example of an intersection of wire groups of FIG. 1.
Figure 8:
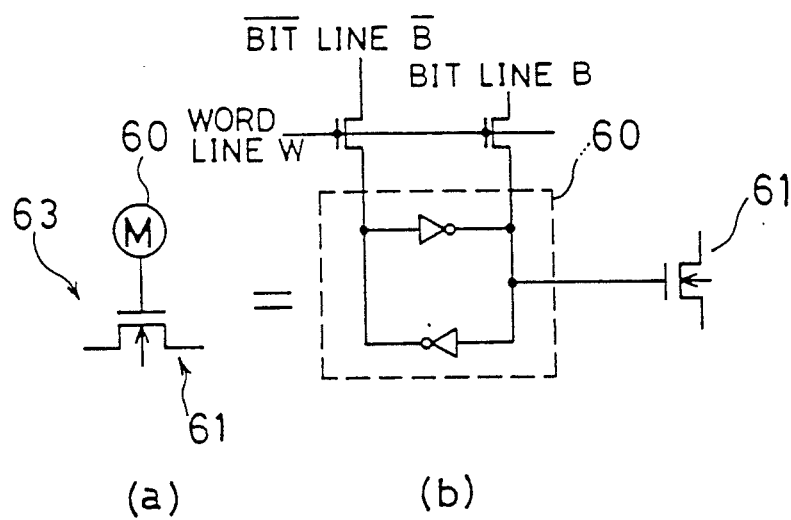
FIG. 8 is a diagram showing an example of a switching element with a memory.
Figure 9:
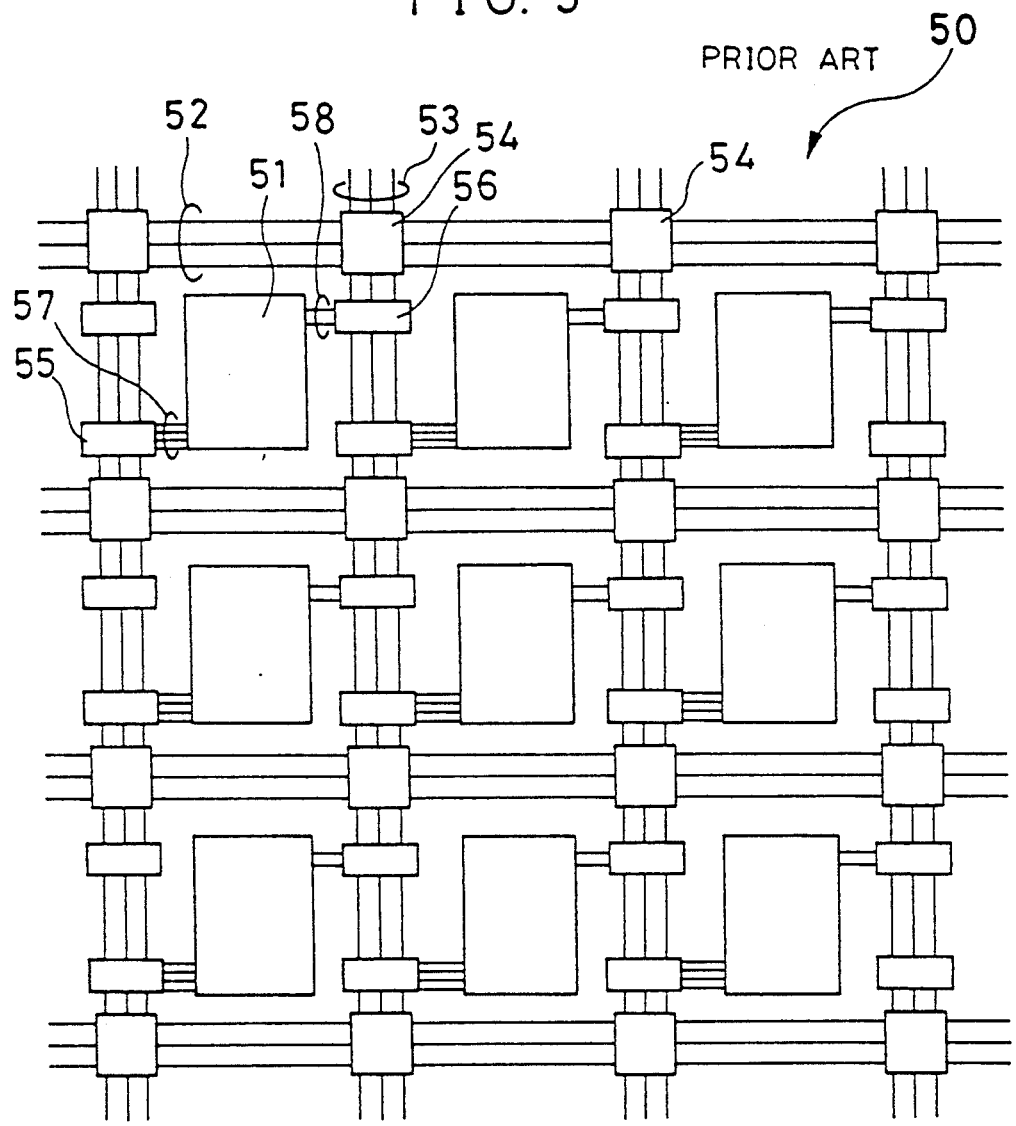
FIG. 9 is a conceptual diagram illustrating a construction of a conventional programmable logic device.
Figure 10:
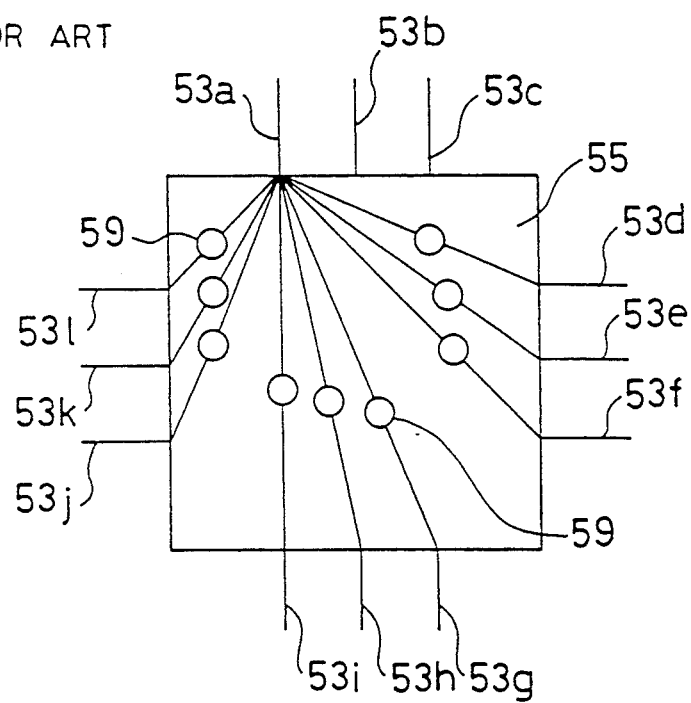
FIG. 10 is a diagram showing a wiring example of a conventional programmable wire switch.

In the example illustrated in FIG. 1, the connecting means provided at the intersections 14 between the horizontal wire groups 12 and the vertical wire groups 13 may herein, as illustrated in, e.g., FIG. 2, directly short-circuit-connect the corresponding vertical wire elements to the horizontal wire elements; or alternatively, as depicted in FIG. 3, the connecting means connect 12a to 13c, 12b to 13b, and 12c to 13a through programmable switching elements 15. The switching elements 15 employed herein may involve the use of, as illustrated in, e.g., FIG. 8, switching elements 63 consisting of NMOS transistors 61 having gate electrode connected to SRAM cells 60.

Figure 4:
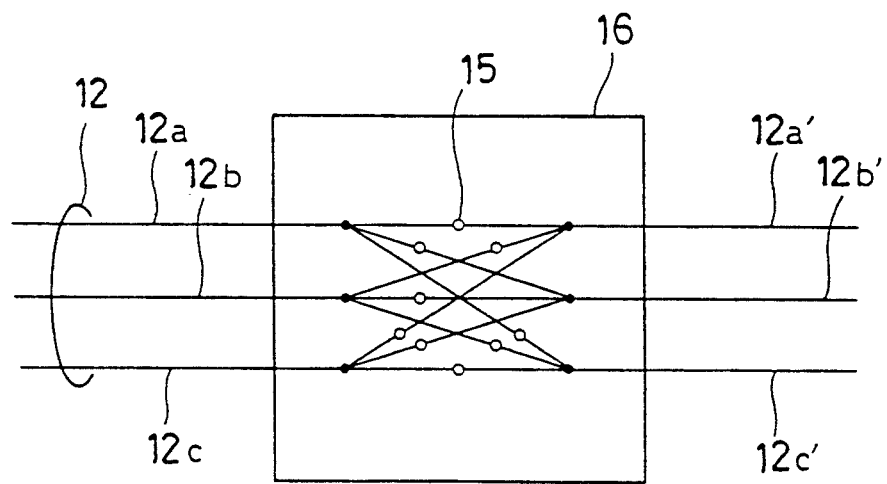
FIG. 4 is a diagram showing an example of a wire switch of FIG. 1.

The wire switches 16 middled between the intersections 14 of the wire groups 12, 13 include, as shown in FIG. 4, a plurality of programmable switching elements 15, thereby making it possible to programmably connect a plurality of parallel wires (wire elements). More specifically, those wires are connectable through 9 pieces of switching elements 15 so that three signal lines 12a, 12b, 12c on the input side of the wire switch 16 are connectable to any of three signal lines 12a', 12b', 12c' on the output side thereof. Besides, the switching element 15 employed herein may involve the use of the above-mentioned switching element 63 provided with a memory illustrated in FIG. 8.

Further, I/O switches 17, 18 are provided for every vertical wire group 13 corresponding to the respective logical elements 11. Input signals from I/O switch 17 to the logical element 11 are transferred and received via, e.g., two wires 19 between the logical element 11 and the vertical wire group 13, while output signals from the logical element 11 to the I/O switch 18 are transferred and received via, e.g., two wires 20 the logical element 11 and the vertical wire group 13.

Figure 5:
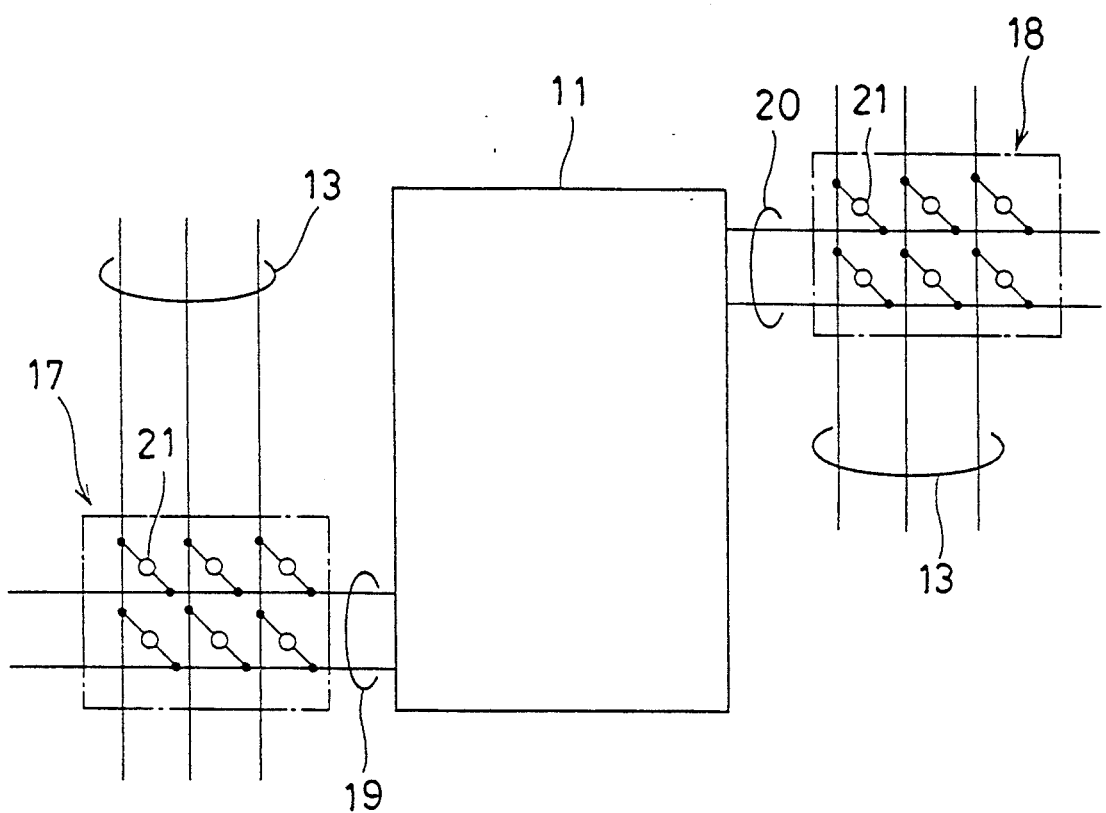
FIG. 5 is a diagram showing an example of an I/O switch.

Namely, as fully illustrated in FIG. 5, two signal lines of the input lines 19 respectively intersect, for instance, the three wire elements of the vertical wire group 13 and are connected to the input terminals of the logical element 11 through programmably connectable switches 21. With this construction, any input signals from the three wire elements of the wire group 13 can be inputted via the I/O switches 17 to the logical element 11. Further, the output terminals of the logical element 11 is connected to the three wire elements of the vertical wire group 13 through the programmable switches 21 as well as through two output lines 20. The output signals from the two output signal lines 20 can be thereby freely outputted to any of the three wire elements of the wire group 13 via the I/O switches 18.

The two corresponding wire elements are directly short-circuit-connected to each other in this manner at the cross intersections 14 of the two wire groups 12, 13; or alternatively the wire elements are connected or disconnected by use of the switching elements 15, and, at the same time, the wire switches 16 including the switching elements 15 are middled between the adjacent intersections 14. It is therefore possible to reduce the number of the employed switching elements 15 in the wire switches. This enhances the using efficiency of the switches and makes it possible to save the space by diminishing the areas occupied by the switching elements.

According to the present invention, when one wire group contains three signal lines, the number of the wire switches 16 is 18 as compared with 54 pieces of switching elements included in the wire switches provided at the intersections of the wire groups in the prior art. It follows that the switching number is reduced by a factor of 3. For example, as illustrated in FIG. 2, when short-circuit-connecting the corresponding wire elements at the intersections 14, the number of all the switching elements for programmably connecting the wire groups 12, 13 in the programmable logical device 10 according to the present invention can be reduced by a factor of 3 as compared with the prior art because of the intersections having no switching element. When the NMOS transistors are used as switching elements, the number of the switching elements for use is decreased, and hence the element occupied areas can be also reduced.

Figure 6:
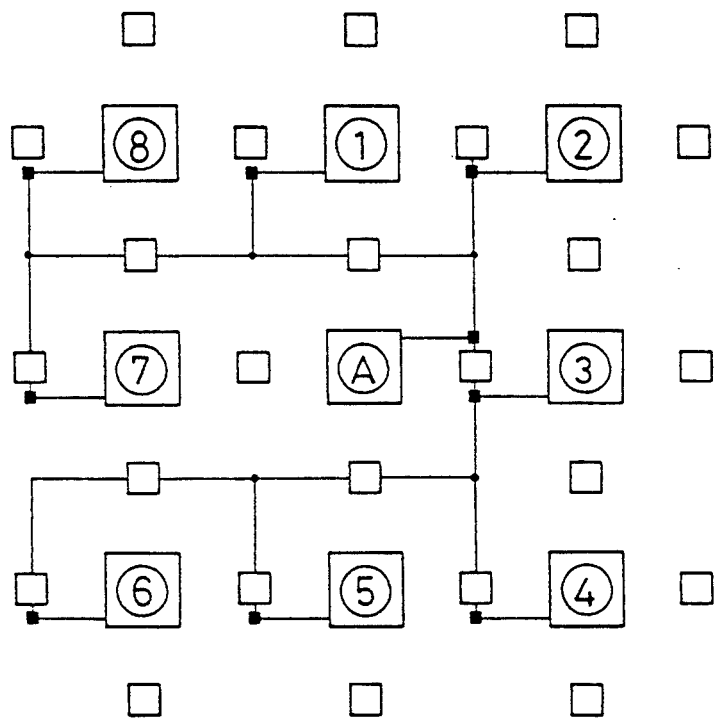
FIG. 6 is an explanatory diagram showing one example of examining the switch passage number when connecting adjacent logical elements in a wire switch placement according to the present invention.
Figure 12:
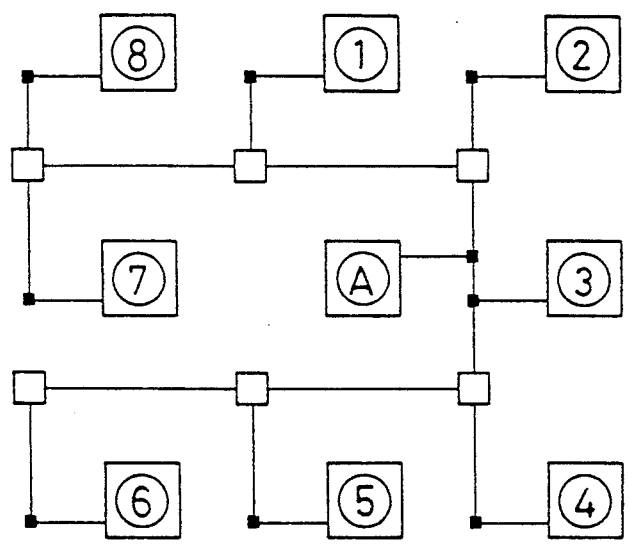
FIG. 12 is an explanatory diagram showing one example of examining the switch passage number when connecting the adjacent logical elements in the conventional wire switch placement.

In addition, as depicted in FIG. 6, in such a model case that a certain specific wire element A is connected sequentially to adjacent wire elements ①-⑧ in the programmable manner, the switch passage number is 4.0 on average, while the switch passage number in the conventional wire switch placement illustrated in FIG. 12 is 3.9 on average. In comparison, the wire switch passage number on the signal route is almost unchanged. Besides, the devices become large scale, and when examining a case where a variety of logical elements are programmably connected, it can be confirmed that there is seen almost no change in the switch passage numbers in the placements of the prior art and the present invention.

Figure 7:
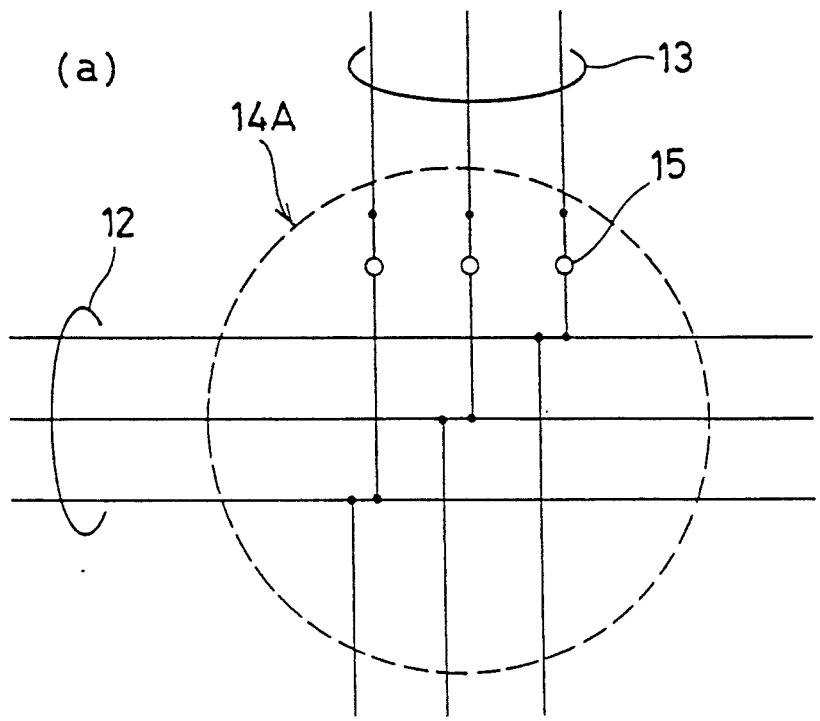
FIGS. 7(a) and 7(b) are diagrams showing another example of the intersection of the wire groups of FIG. 1.
Figure 7:
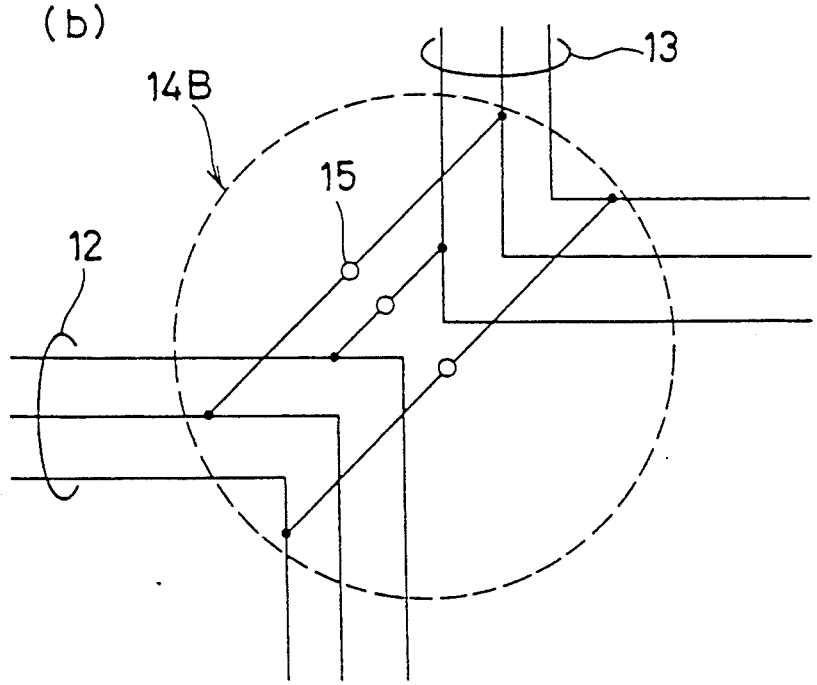

Note that the respective embodiments discussed above have dealt with the cases of effecting, as illustrated in FIG. 2, the direct short-circuit connections of the wire groups 12, 13 which intersect in crosses with respect to the configuration of the intersection 14, and of performing, as illustrated in FIG. 3, the connections by use of the switching elements 15. The present invention is not, however, limited to these embodiments. The present invention is of course applicable, for instance, as depicted in FIG. 7(a), to an intersection 14A in which the switching elements 15 are connected in series to the wire elements of the wire group 13 and also, as depicted in FIG. 7(b), to an intersection 14B configured by the wire groups 12, 13 each assuming an L-shape.

Further, in the respective embodiments discussed above, each of the wire groups 12, 13 contains three wires (signal lines) or wire elements. The present invention is not, however, limited to this, and any number of such wire elements are available. Besides, the number of the input or output lines to the logical element 11 from the wire groups 12, 13 is not limited to 2, and any number of lines are also available. Moreover, in the respective embodiments described above, the wire groups 12, 13 intersect in cross at the intersection 14. The present invention is not, however, limited to this configuration. The wire groups may intersect in any form on condition that the corresponding wire elements intersect each other to configure the intersection 14.

As discussed above, according to the present invention, two groups of wire elements combined to intersect are directly short-circuit-connected at the intersections, preferably cross intersections in which the wire groups arranged lengthwise and crosswise in channels between the logical elements arranged in array are combined to intersect each other; or alternatively the wire elements of two wire groups intersecting each other are programmably disconnected by use of the switching elements and at the same time programmably connected through the wire switches. It is therefore possible to reduce the number of the used switching elements in the wire switch. This in turn increases the using efficiency of the switch, and the space can be saved by diminishing the areas occupied by the switching elements. Thus, the programmable logic device according to the present invention is capable of attaining a high degree of freedom of wiring and a high integration.

Although the illustrative embodiments of the present invention have been described in detail with reference to the accompanying drawings, it is to be understood that the present invention is not limited to those embodiments. Various changes or modifications may be effected thereby by one skilled in the art without departing from the scope or spirit of the invention.

What is claimed is:

1. A programmable logic device comprising:
 a plurality of logical elements arranged in an array; and
 wire means disposed in vertical and horizontal channels between said logical elements to connect arbitrarily and programmably said logical elements,
 wherein said wire means include:
 wire groups each consisting of a plurality of wire elements and combinable to intersect each other;
 connecting means, provided at intersections of said wire groups, for connecting one wire element of one wire group to a corresponding wire element of another wire group of two wire groups combinable to intersect each other at the intersection; and
 switching means, provided between adjacent intersections, for connecting programmably and mutually said plurality of wire elements of each said wire group.

2. The programmable logic device according to claim 1, wherein said two wire groups combinable to intersect each other consist of the same number of wire elements.

3. The programmable logic device according to claim 1, wherein said connecting means short-circuit-connects the one wire element to the corresponding wire element at the intersection.

4. The programmable logic device according to claim 3, wherein corresponding wire elements belonging to respective wire groups are short-circuit-connected in crosses at the intersection.

5. The programmable logic device according to claim 3, wherein corresponding wire elements belonging to respective wire groups are combined in crosses at the intersections.

6. The programmable logic device according to claim 5, wherein corresponding wire elements belonging to respective wire groups are in an L-shape.

7. The programmable logic device according to claim 3, wherein corresponding wire elements belonging to respective wire groups intersect each other at the intersection.

8. The programmable logic device according to claim 3, wherein corresponding wire elements belonging to respective groups intersect each other in crosses at the intersection.

9. The programmable logic device according to claim 1, wherein said connecting means is composed of a programmable switching element for determining one of a connection and a disconnection between one wire element and the corresponding wire element at the intersection.

10. The programmable logic device according to claim 9, wherein corresponding wire elements belonging to respective wire groups are combined in crosses at the intersections.

11. The programmable logic device according to claim 10, wherein corresponding wire elements belonging to respective wire groups are in an L-shape.

12. The programmable logic device according to claim 9, wherein corresponding wire elements belonging to respective wire groups intersect each other at the intersection.

13. The programmable logic device according to claim 9, wherein corresponding wire elements belonging to respective wire groups intersect each other in crosses at the intersection.

* * * * *